US011116115B1

(12) United States Patent
Lin

(10) Patent No.: US 11,116,115 B1
(45) Date of Patent: Sep. 7, 2021

(54) HIGH POWER DENSITY POWER SUPPLY

(71) Applicant: Chyng Hong Electronic Co., Ltd., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 16/875,758

(22) Filed: May 15, 2020

(51) Int. Cl.
*H05K 7/20* (2006.01)
*H05K 5/03* (2006.01)
*H05K 7/14* (2006.01)

(52) U.S. Cl.
CPC ........... *H05K 7/20909* (2013.01); *H05K 5/03* (2013.01); *H05K 7/1427* (2013.01)

(58) Field of Classification Search
CPC ..... H05K 7/20909; H05K 7/1427; H05K 5/03
See application file for complete search history.

(56) References Cited

U.S. PATENT DOCUMENTS

| 8,153,903 | B2 * | 4/2012 | Kanouda | ................. | H05K 5/02 174/255 |
| 10,123,442 | B1 | 11/2018 | Lin | | |
| 2005/0035952 | A1 * | 2/2005 | Chen | ..................... | G06F 3/045 345/173 |
| 2012/0113603 | A1 * | 5/2012 | Tokunaga | .......... | H05K 7/20445 361/752 |

\* cited by examiner

*Primary Examiner* — Mukundbhai G Patel
(74) *Attorney, Agent, or Firm* — Sinorica, LLC

(57) ABSTRACT

A high power density power supply includes at least one power module and a cooling fan in a casing. A first filter circuit board facing upward is provided below the cooling fan. A second filter circuit board facing downward is provided above the cooling fan. The back of the second filter circuit board is provided with a plurality of buffer pads. An insulating plate is disposed on the buffer pads to completely cover the top of the second filter circuit board. Thereby, the insulating plate provided an insulating effect between an upper cover of the casing and the second filter circuit board to prevent the second filter circuit board from directly contacting the upper cover to form a short circuit, so as to improve the safety of the power supply.

3 Claims, 8 Drawing Sheets

HIGH POWER DENSITY POWER SUPPLY

FIELD OF THE INVENTION

The present invention relates to a power supply, and more particularly to a high power density power supply which integrates power modules with filters in a casing.

BACKGROUND OF THE INVENTION

In general, a power supply is composed of a power switch component (such as a power transistor, a power diode, etc.), an electrical energy storage, and a filter component (such as an inductor, a capacitor, a transformer, a choke coil, etc.), and a detection and control component. Thereby, the voltage or current is regulated (switched and rectified) by the detection and control component to control the power switch component. The electric energy storage and the filter component provide the required filtering and temporary electrical energy storage for converting the electric energy. However, during the power conversion, part of the energy supplied from the power supply is converted into heat energy. The heat energy is concentrated in the power transistor.

The demand for power supplies used for industrial is extremely large. The power supply is mounted to a chassis through a rack. A general business gathers power supplies and servers in a computer room to facilitate management. The power supplies and the servers are running all day long. Therefore, the heat dissipation of the power supplies is particularly important. For the convenience of management and space saving, the casing for the rack-type power inverter usually adopts a common industrial standard, its width is fixed at 19 inches, height in U units (1 U=1.75 inches=44.45 mm). The standard casings are usually 1 U, 2 U, 3 U, and others. In general, at the same power, the power inverter composed of a power switch component, a power storage, and a filter component, and a detection and control component needs better heat dissipation conditions, so it is necessary to use a larger casing, such as a casing of 3 U or more.

However, the input voltage of the above power supply is usually limited to 220V or 380V. The industry develops a general-purpose power supply of 180-460V. However, because the power supply needs more electronic components and is larger in size and the condition for heat dissipation is more strict, it often results in poor heat dissipation. The reason is that the internal space of the casing is small and the electronic components block the wind blowing of the fan, which cannot provide a smooth heat dissipation path. As a result, the heat dissipation of the power transistors disposed at the rear is poor. The power supply may stop running or fail or be damaged due to overheating.

In view of the above deficiencies, the inventor of the present invention invented a High Power Density Power Supply, as disclosed in U.S. Pat. No. 101,123,442. Referring to FIG. 1 and FIG. 2, the power supply 200 has a metal casing 201. A metal upper cover 202 is covered on the casing 201. A plurality of cooling fans 210 are provided in the casing 201. A first filter circuit board 220 and a power module 230 are provided on both sides of each cooling fan 210 in the casing 201. The first filter circuit board 220 is provided with a first filter 221 facing upward. A second filter circuit board 240 is reversely arranged above the cooling fan 210, and is fixed above the cooling fan 210 by an insulating plate 250. The second filter circuit board 240 is provided with a second filter 241 facing downward. In this way, since the first filter 221 and the second filter 241 are interlaced and located above and below the cooling fan 210, the spaces above and below the cooling fan 210 can be fully utilized to improve a heat flow path, and the cooling fan 210 can effectively cool the power module 230, that is, in the casing 201 with high power density, a good heat dissipation effect can still be achieved.

However, since the second filter 241 is soldered to the second filter circuit board 240 with its pin 242, a protruding part of the pin 242 is formed on the back of the second filter circuit board 24. Since the protruding pin 242 faces upward, although it is separated from the upper cover 202 of the power supply 200 by a predetermined distance, if the upper cover 202 is accidentally pressed down, the upper cover 202 is easily deformed and recessed to be in contact with the protruding pin 242 to cause a short circuit. It is easy to cause the power supply 200 to malfunction, or even explode and catch fire. Accordingly, the inventor of the present invention has devoted himself based on his many years of practical experiences to solve these problems.

SUMMARY OF THE INVENTION

The primary object of the present invention is to provide a high power density power supply that integrates power modules with filters in a casing of the power supply. The power supply can prevent an upper cover of the power supply and a protruding pin of a second filter from forming a short circuit, thereby improving the safety of the power supply.

In order to achieve the aforesaid object, the high power density power supply of the present invention comprises a casing. The casing has a panel at a front side thereof. At least one power module is arranged in the casing and is perpendicular to the panel. A front side of each power module is provided with a cooling fan. A first filter circuit board is provided below the cooling fan. A second filter circuit board that is electrically connected to the first filter circuit board is provided in reverse above the cooling fan. The high power density power supply further comprises a plurality of buffer pads and an insulating plate. The buffer pads are disposed on a back of the second filter circuit board, respectively. The insulating plate is disposed on the buffer pads. The insulating plate completely covers a top of the second filter circuit board.

In the high power density power supply provided by the present invention, since the insulating plate covers the top of the second filter circuit board, if the upper cover of the casing is pressed down, the insulating plate provides an insulating effect between the upper cover and the second filter circuit board. Therefore, it is possible to prevent the second filter circuit board from directly contacting with the upper cover to form a short circuit, so as to improve the safety of use of the power supply.

DETAILED DESCRIPTION OF THE PREFERRED EMBODIMENTS

Embodiments of the present invention will now be described, by way of example only, with reference to the accompanying drawings.

Figure 1:
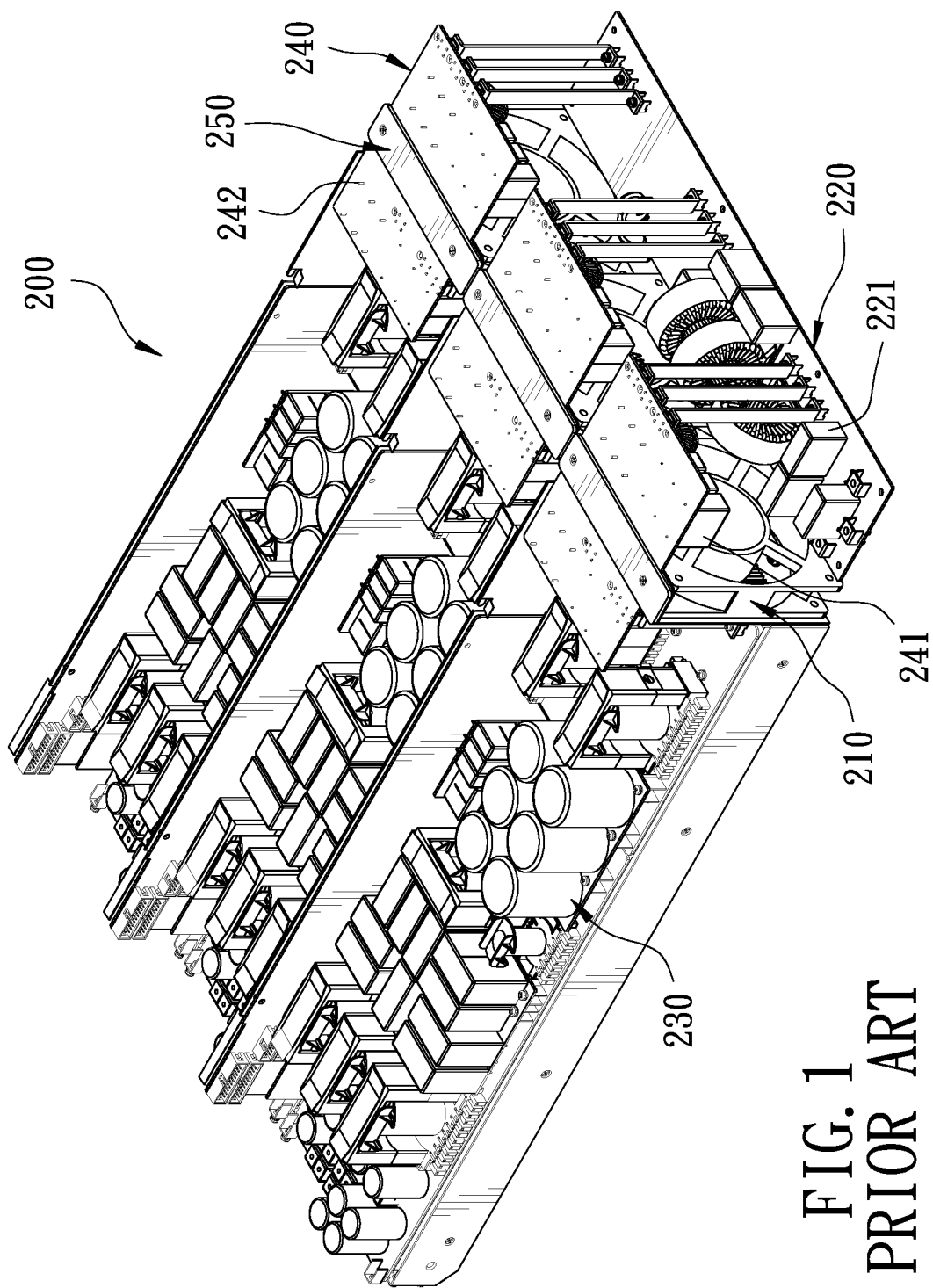
FIG. 1 is a perspective view of the power modules in the casing disclosed in Taiwan Utility Model Publication M558454.
Figure 2:
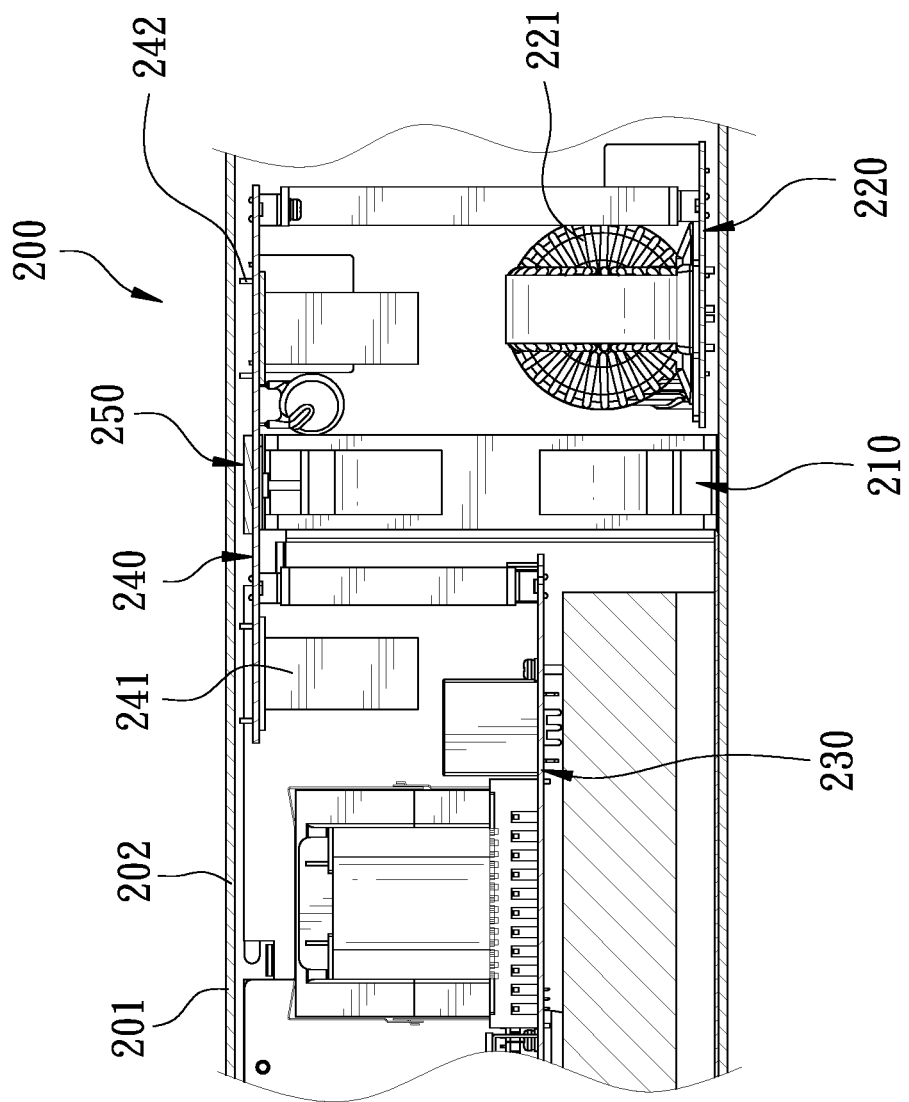
FIG. 2 is a side sectional view of the power supply disclosed in Taiwan Utility Model Publication M558454.
Figure 3:
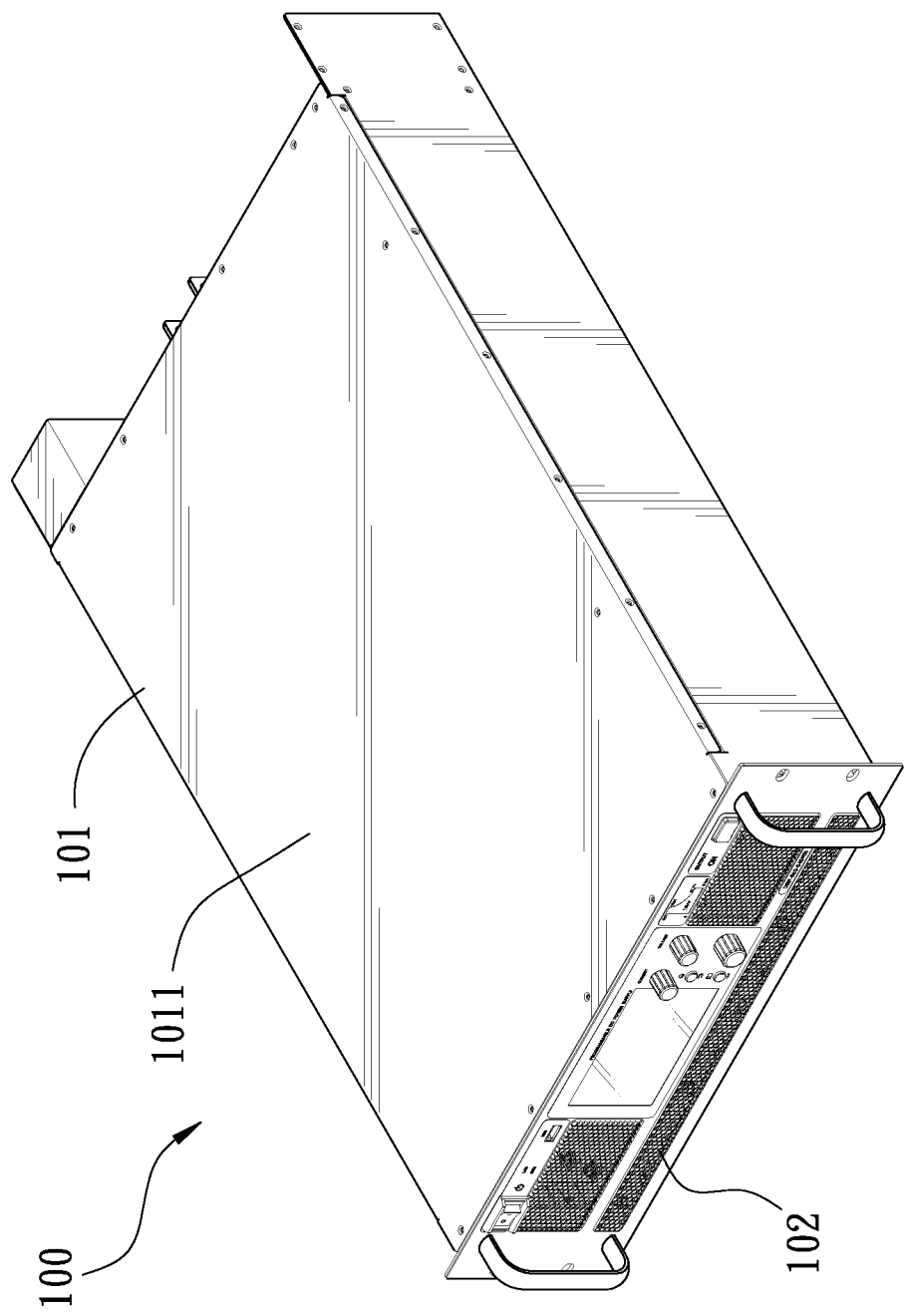
FIG. 3 is a perspective view of the power supply according to a preferred embodiment of the present invention.
Figure 4:
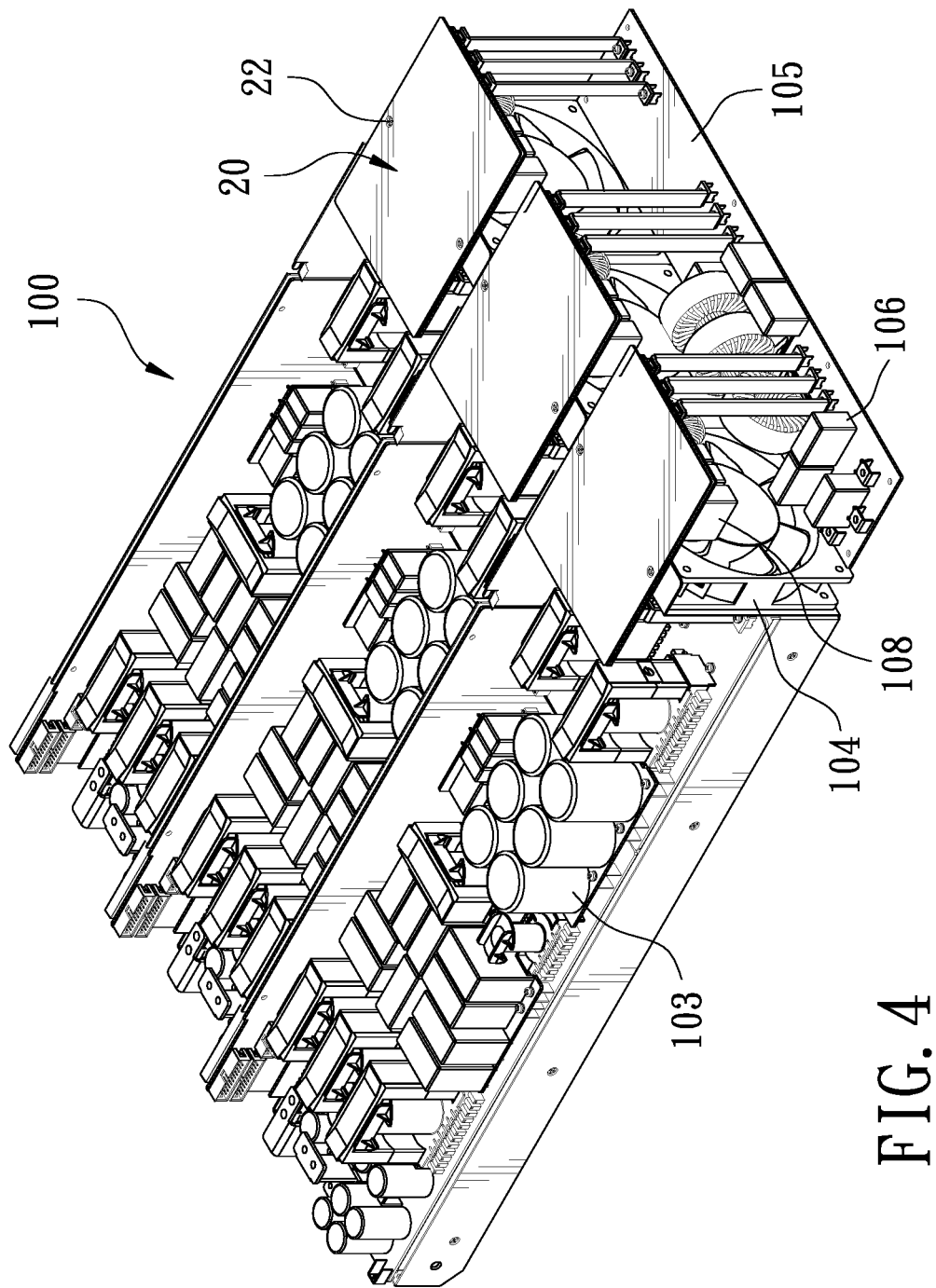
FIG. 4 is a perspective view of the power modules in the casing according to the preferred embodiment of the present invention.
Figure 5:
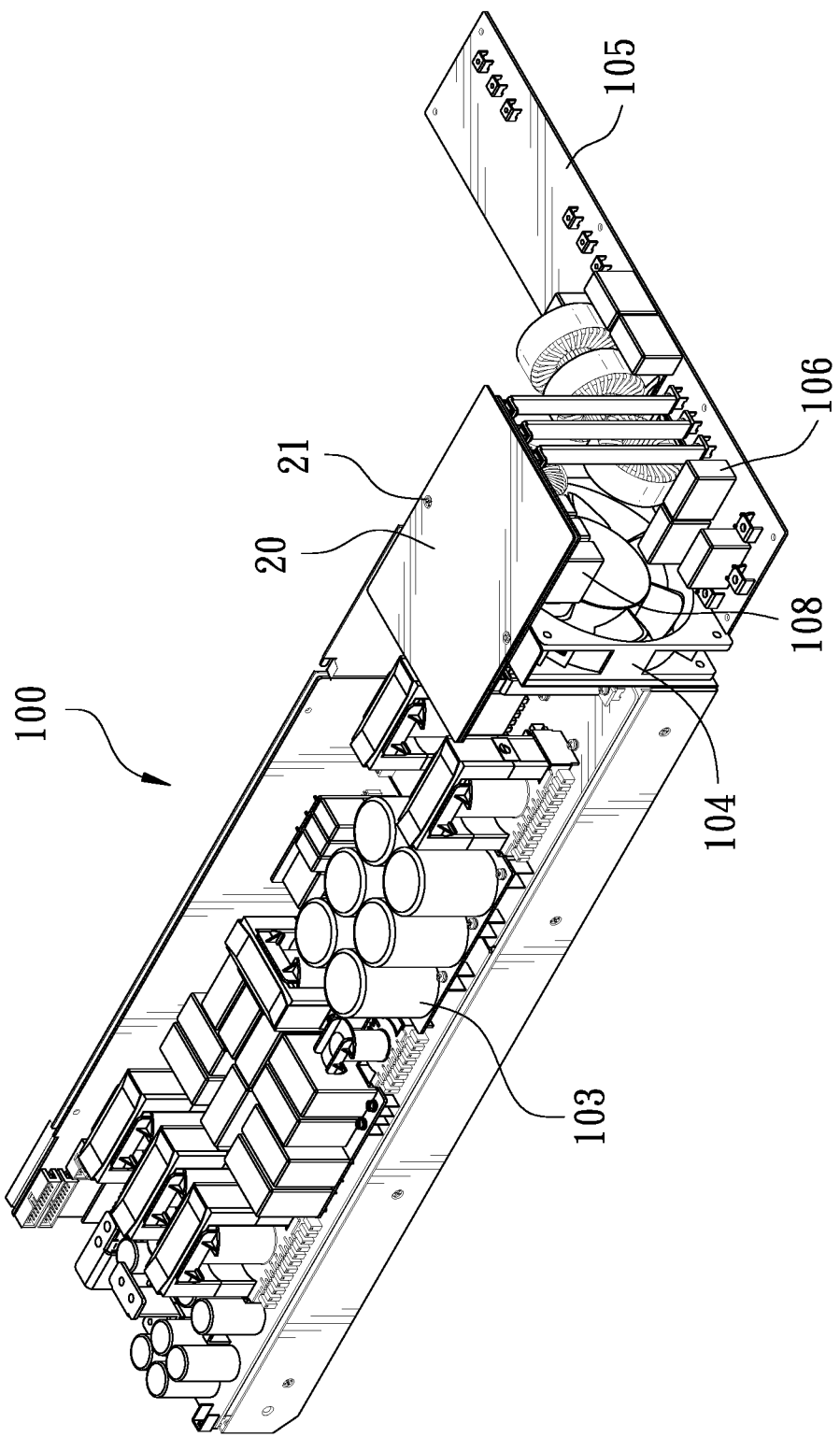
FIG. 5 is a perspective view of one power module according to the preferred embodiment of the present invention.
Figure 6:
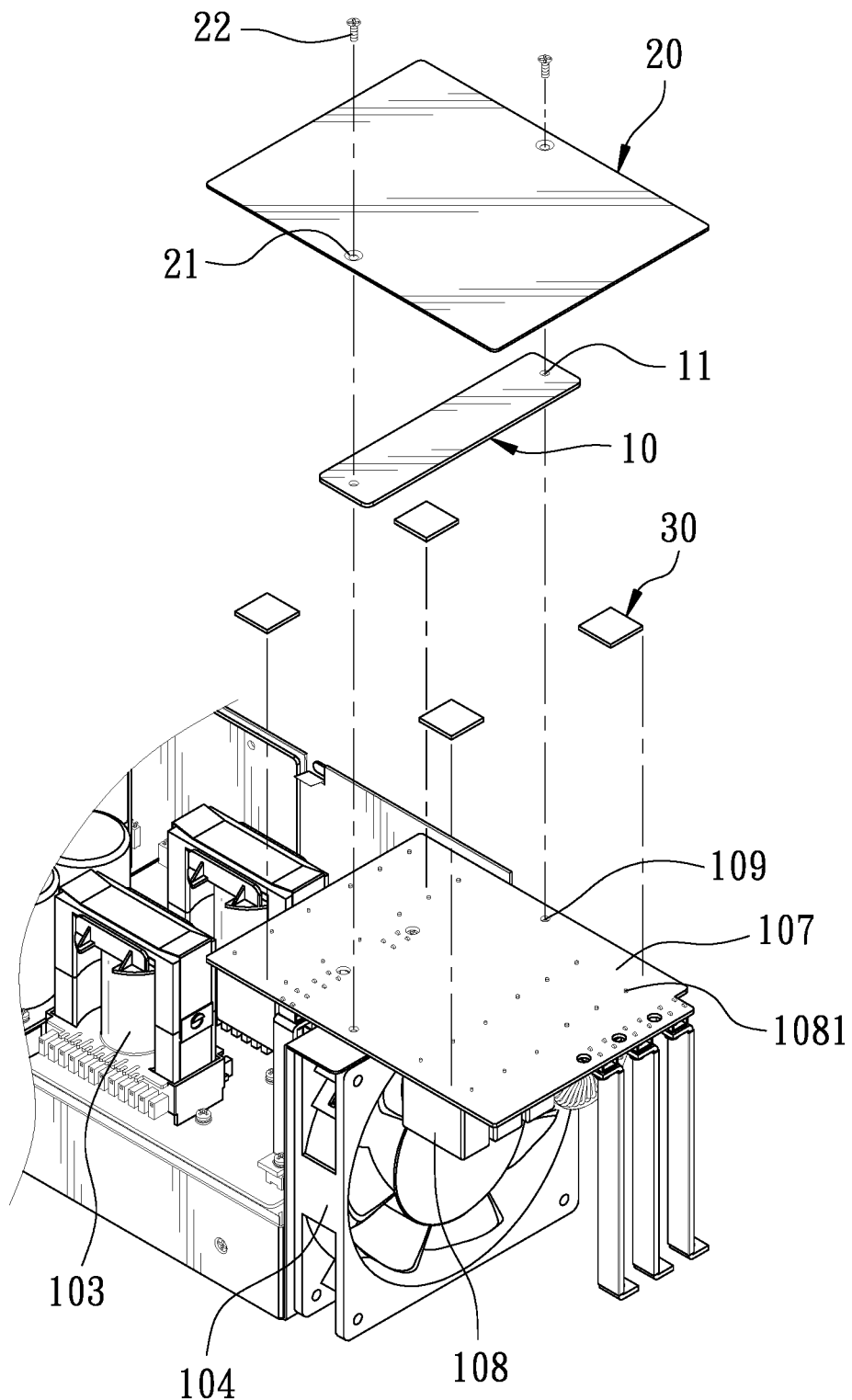
FIG. 6 is a partially exploded view of one power module according to the preferred embodiment of the present invention.

FIG. 3 is a perspective view of the power supply according to a preferred embodiment of the present invention. FIG. 4 is a perspective view of the power modules in the casing according to the preferred embodiment of the present invention. FIG. 5 is a perspective view of one power module according to the preferred embodiment of the present invention. FIG. 6 is a partially exploded view of one power module according to the preferred embodiment of the present invention. The present invention discloses a high power density power supply which integrates power modules with filters in a casing. The high power density power supply 100 comprises a casing 101. The casing 101 has a panel 102 at a front side thereof. A plurality of power modules 103 are arranged side by side in the casing 101 and are perpendicular to the panel 102. A cooling fan 104 is provided in front of each power module 10. A first filter circuit board 105 is provided below the cooling fan 104. The first filter circuit board 105 is provided with a first filter 106 facing upward. A second filter circuit board 107 that is electrically connected to the first filter circuit board 105 is provided in reverse above the cooling fan 104, so that the back of the second filter circuit board 107 faces up. The second filter circuit board 107 is provided with a second filter 108 facing downward. The second filter circuit board 107 is formed with a plurality of fixing holes 109. The main improvement of the present invention is described below.

The high power density power supply 100 further comprises an insulating sheet 10, a plurality of buffer pads 30, and an insulating plate 20.

The insulating sheet 10 is formed with a plurality of through holes 11 corresponding to the fixing holes 109. The insulating sheet 10 is disposed on the second filter circuit board 107.

The plurality of buffer pads 30 are made of bakelite. The buffer pads 30 are disposed on the back of the second filter circuit board 107, respectively. In this embodiment, the second filter circuit board 107 is rectangular, and the buffer pads 30 are disposed on the four corners of the second filter circuit board 107 in an adhesive manner, respectively.

The insulating plate 20 is disposed on the buffer pads 30. The insulating plate 20 is also rectangular and can completely cover the top of the second filter circuit board 107. The insulating plate 20 is formed with a plurality of locking holes 21 corresponding to the through holes 11. A plurality of bolts 22 are respectively inserted through the locking holes 21, the through holes 11 and the fixing holes 109 to lock the insulating plate 20, the insulating sheet 10 and the second filter circuit board 107 to the cooling fan 104, so that the insulating sheet 10 is positioned between the insulating plate 20 and the second filter circuit board 107.

In order to further understand the structural features, the technical means and the expected effect of the preset invention, the use of the preset invention is described hereinafter.

Figure 7:
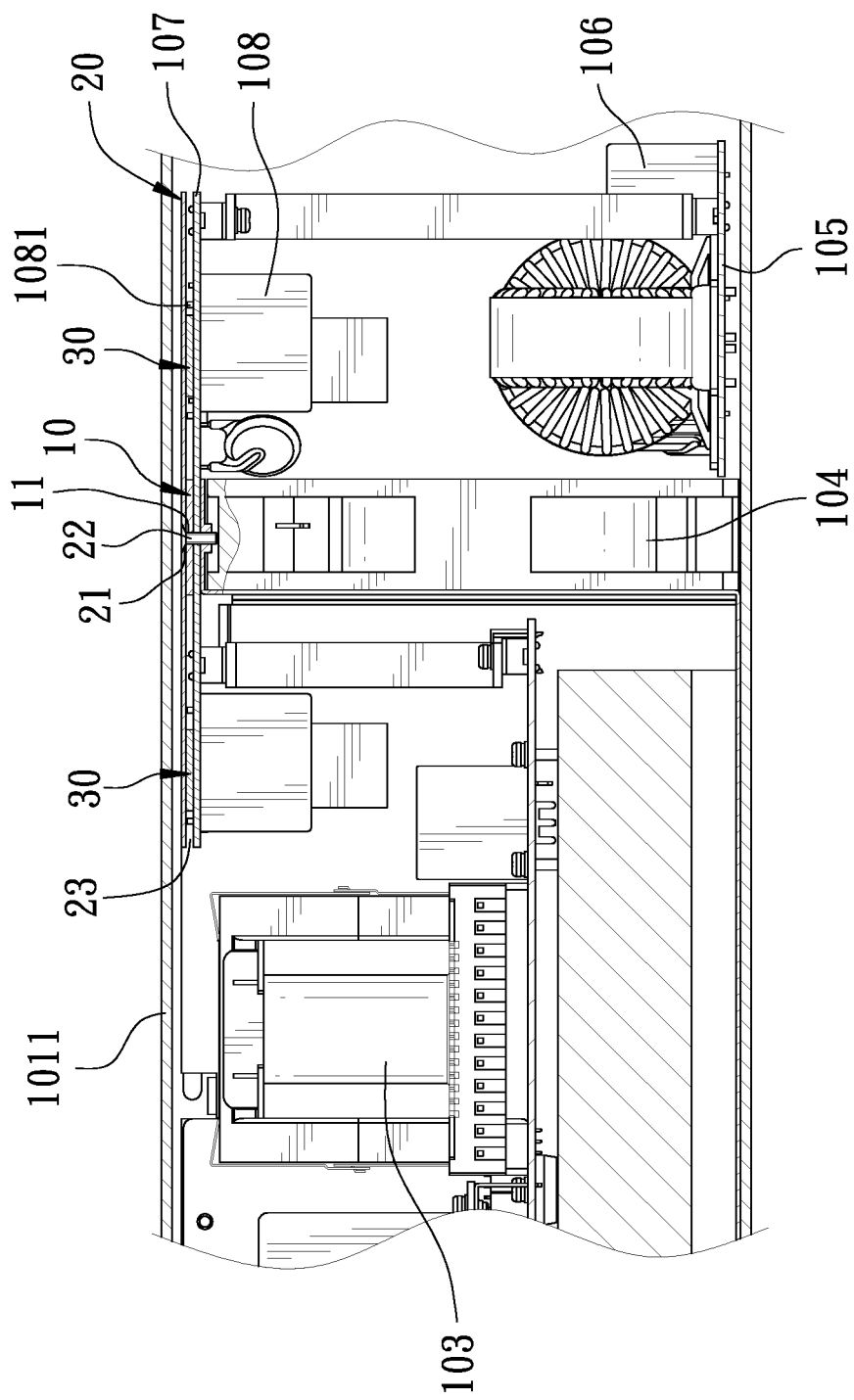
FIG. 7 is a side sectional view of one power module according to the preferred embodiment of the present invention.
Figure 8:
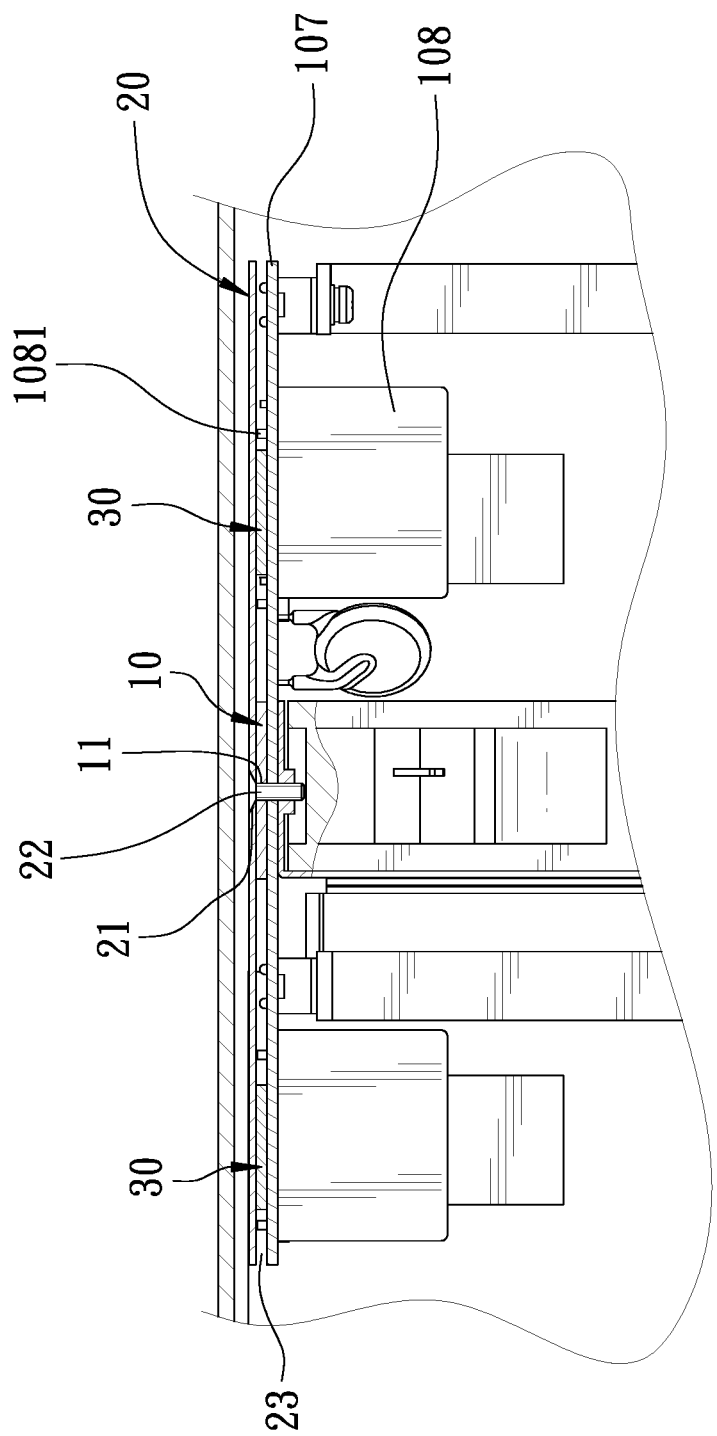
FIG. 8 is a partially enlarged view of FIG. 7.

FIG. 7 is a side sectional view of one power module according to the preferred embodiment of the present invention. FIG. 8 is a partially enlarged view of FIG. 7. Through the insulating sheet 10, a distance 23 is defined between the second filter circuit board 107 and the insulating plate 20, which can avoid that a protruding pin 1081 of the second filter 108 is in direct contact with the upper cover 1011 of the casing 101 to form a short circuit.

Furthermore, since the insulating plate 20 covers the second filter circuit board 107, if the upper cover 1011 of the casing 101 is pressed down and deformed, the insulating plate 20 is located between the upper cover 1011 of the casing 101 and the second filter circuit board 107 to provide an insulating effect. This can prevent the exposed protruding pin 1081 of the second filter 108 from contacting the upper cover 1011 of the casing 101 to form a short circuit, so as to improve the safety of use of the power supply 100.

It is worth mentioning that since the corners of the second filter circuit board 107 are provided with the buffer pads 30, the distance 23 between the second filter circuit board 107 and the insulating plate 20 can be strengthened, so that the protruding pin 1081 of the second filter 108 can be stably separated from the insulating plate 20 by the distance, and the protruding pin 1081 of the second filter 108 is prevented from breaking through the insulating plate 20 and contacting the upper cover 1011 of the casing 101 to form a short circuit, thereby improving the safety of the power supply.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A high power density power supply, comprising a casing, the casing being covered with an upper cover, at least one power module being provided in the casing, a cooling fan being provided in front of the power module, a first filter circuit board being provided below the cooling fan, a second filter circuit board being provided in reverse above the cooling fan so that a back of the second filter circuit board faces up, characterized in that: the high power density power supply further comprises a plurality of buffer pads and an insulating plate; the buffer pads are disposed on the back of the second filter circuit board, respectively; the insulating plate is disposed on the buffer pads, the insulating plate completely covers a top of the second filter circuit board, through the buffer pads, a distance is defined between the insulating plate and the second filter circuit board, wherein an insulating sheet is provided between the insulating plate and the second filter circuit board and located above the cooling fan, the second filter circuit board, the insulating sheet and the insulating plate are locked to the cooling fan by a plurality of bolts.

2. The high power density power supply as claimed in claim 1, wherein the second filter circuit board and the insulating plate are rectangular, and the buffer pads are adhered to four corners of the second filter circuit board, respectively.

3. The high power density power supply as claimed in claim 1, wherein the buffer pads are made of bakelite.

\* \* \* \* \*